United States Patent
Lagerberg et al.

[11] Patent Number: 6,094,949
[45] Date of Patent: Aug. 1, 2000

[54] LOCK DEVICE FOR ELECTRONIC TEST APPARATUS

[75] Inventors: Christopher W. Lagerberg, Seattle; Joseph V. Ferrante, Redmond, both of Wash.

[73] Assignee: Fluke Corporation, Everett, Wash.

[21] Appl. No.: 09/294,463

[22] Filed: Apr. 19, 1999

[51] Int. Cl.[7] .................................................. E05B 73/00
[52] U.S. Cl. ..................... 70/14; 70/18; 70/58; 292/37; 292/283
[58] Field of Search .................................. 70/58, 18, 14, 70/30, 49; 292/41, 42, 37, 283, 284

[56] References Cited

U.S. PATENT DOCUMENTS

| | | | |
|---|---|---|---|
| 918,662 | 4/1909 | Drucker | 292/37 |
| 1,264,814 | 4/1918 | Kornstein | 292/27 |
| 1,977,853 | 10/1934 | Kemp | 70/118 |
| 2,664,611 | 1/1954 | Shomber | 292/37 |
| 4,168,616 | 9/1979 | Goldman | 70/119 |
| 4,423,895 | 1/1984 | Mosley, Jr. | 292/36 |
| 4,432,573 | 2/1984 | Goldman | 292/37 |
| 4,823,568 | 4/1989 | Rogers et al. | 70/58 |
| 5,140,836 | 8/1992 | Hogan et al. | 70/57.1 |
| 5,509,700 | 4/1996 | Kennedy, Jr. | 292/3 |

FOREIGN PATENT DOCUMENTS 384164  8/1990  European Pat. Off. ............... 70/58

Primary Examiner—B. Dayoan
Assistant Examiner—Clifford B Vaterlaus
Attorney, Agent, or Firm—George T. Noe

[57] ABSTRACT

A lock device for electronic apparatus is provided as a non-intrusive and removable attachment, The lock device has an actuating member that translates linear movement along a longitudinal axis to linear movement of a pair of retractable lugs along a transverse axis. The lock device is designed for use with an electronic instrument having an accessory-receiving cavity or recess built into its plastic case. The recess includes a pair of pockets on either side into which corresponding lugs of the lock device may be received.

2 Claims, 2 Drawing Sheets

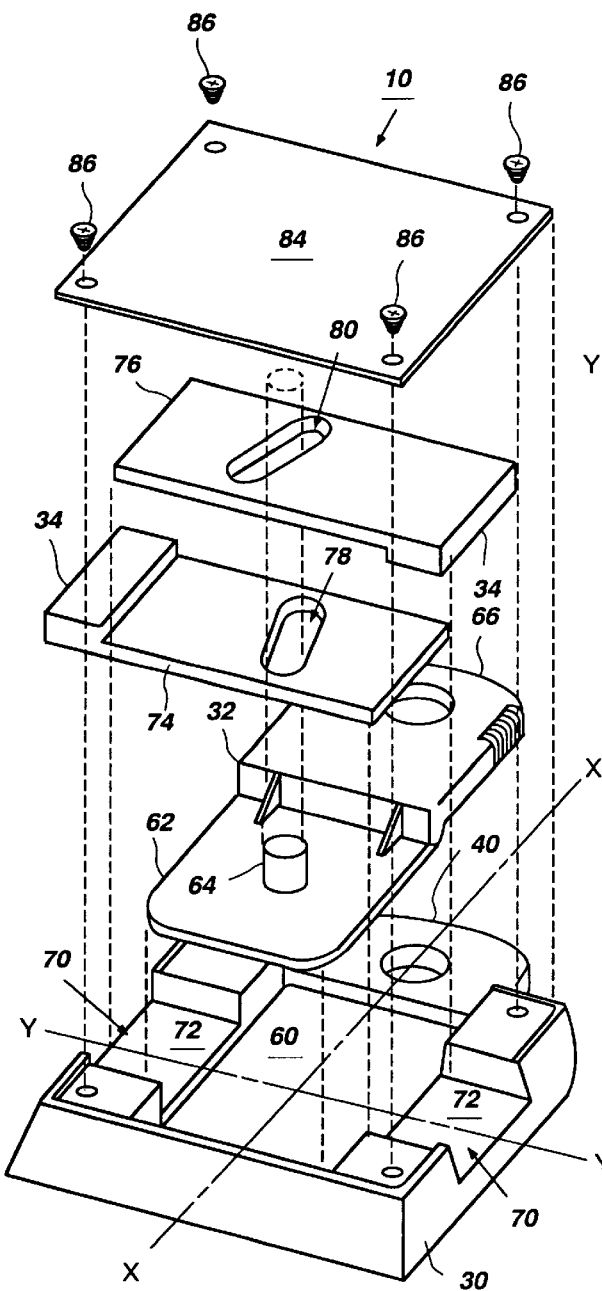
Fig. 3
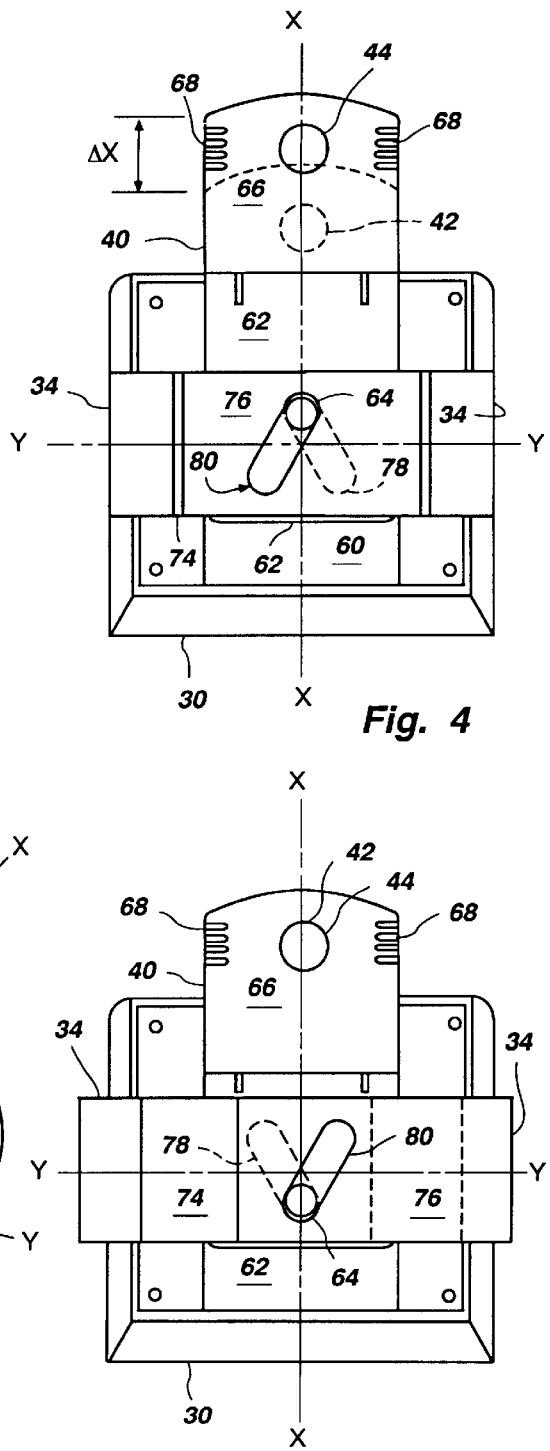
Fig. 4
Fig. 5

LOCK DEVICE FOR ELECTRONIC TEST APPARATUS

BACKGROUND OF THE INVENTION

This invention relates generally to lock devices, and in particular to a lock device for securing electronic test apparatus.

Portable hand-held electronic instruments for use in servicing and testing a wide variety of electrical parameters are extremely popular in today's mobile work environment simply because they can be taken to the job site or where a problem is to be resolved. Such instruments are now being characterized as tools, and include a wide array of what were once classified as laboratory or "bench-top" test and measurement instruments, such as multimeters, oscilloscopes, process calibrators, cable testers and network troubleshooters, and the like.

Considerable effort has been made to enhance the portability of these instruments by providing ways to include or attach accessory items, such as probes, test leads, and various adapters or devices for converting physical parameters like temperature and pressure to electrical quantities. Now there is a trend toward enhancing the versatility and convenience, as well as safety, of these instruments once they are on the job. In U.S. application Ser. No. 09/144,183, filed Aug. 31, 1998, and assigned Fluke Corporation, an electronic instrument is provided with an accessory-receiving cavity or recess built into its plastic case. The recess includes a pair of pockets on either side into which corresponding tabs of a flexible accessory mount may be received. The accessory mount snaps into place, and is easily removed, and provides an inexpensive, reliable, and convenient method of accommodating accessory items such as straps and the like for hands-free operation.

It is often desired to leave electronic test apparatus unattended; however, the portability of small instruments also makes it easy for someone to take them or remove them from a service environment. Even simply moving the instrument a few inches could result in a test lead or probe pulling loose from its test node and unintentionally contacting unsafe voltages or creating hazardous short circuits. Thus, it has become a common practice under some circumstances to actually lock the instrument in place. These circumstances typically involve situations in which a test set-up has been made to monitor a piece of electrical equipment for intermittent problems or elusive events which the instrument can capture without the service technician being there. For example, if a multimeter is found locked to an electrical cabinet, other technicians should know not to disturb the test set-up and allow only the person who locked the instrument in place to remove it. Unfortunately, this is not always the case, and service technicians return to their unattended instrument only to find it removed from its test location.

Conventional wisdom would dictate adding some sort of permanent fixture to the instrument, such as a molding into the instrument case a locking ring or gluing a fixture to the instrument. However, in providing an instrument intended for general usage, this would be an unnecessary addition and expense for those having no need for such a fixture.

SUMMARY OF THE INVENTION

In accordance with the present invention, a lock device for electronic apparatus is provided as a non-intrusive and removable attachment. The lock device has an actuating member that translates linear movement along a longitudinal axis to linear movement of a pair of retractable lugs along a transverse axis. The lock device is designed for use with an electronic instrument having an accessory-receiving cavity or recess built into its plastic case. The recess includes a pair of pockets on either side into which corresponding lugs of the lock device may be received.

The lock device comprises a main body that has a projection or tang extending therefrom. The main body is preferably molded of a tough, durable plastic, but could be fabricated of a metal through machining or diecasting processes. A pair of retractable locking lugs are disposed with the body, and when in their extended position, secure the the lock device to the electronic apparatus. An actuating member is disposed within the main body, and includes a pin or boss which engages angled slots in the retractable locking lugs. In one position, the actuating member is extended longitudinally from the body and the locking lugs are retracted. In a second position, the actuating member is not extended from the body, but is aligned with a portion of the body, and the locking lugs are extended. In the second position, openings in the actuating member and body are in registration with each other, permitting placing an elongate device through the openings to prevent movement of the actuating member relative to the body.

It is therefore one object of the present invention to provide a lock device for electronic apparatus.

It is another object of the present invention to provide a removable lock device for an electronic instrument having an accessory-receiving recess.

Other objects, features, and advantages of the present invention will become obvious to those having ordinary skill in the art upon a reading of the following description when taken in conjunction with the accompanying drawings.

BRIEF DESCRIPTION OF THE DRAWINGS

FIG. 3 is an exploded view of a lock device constructed in accordance with the present invention;

FIG. 4 is a plan view of a lock device in accordance with the present invention with the cover plate removed to illustrate the lock in the closed position; and FIG. 5 is a plan view of a lock device in accordance with the present invention with the cover plate removed to illustrate the lock in the open position.

DETAILED DESCRIPTION OF THE INVENTION

Figure 1:
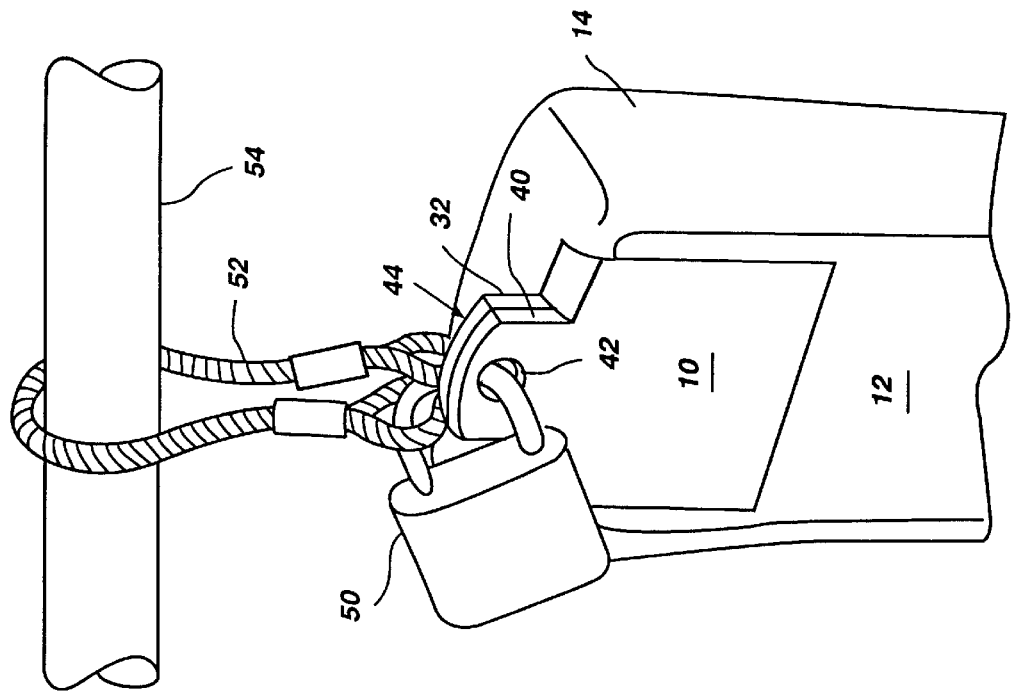
FIG. 1 is an environmental view of a portable electronic apparatus adapted to receive a lock device in accordance with the present invention.
Figure 2:
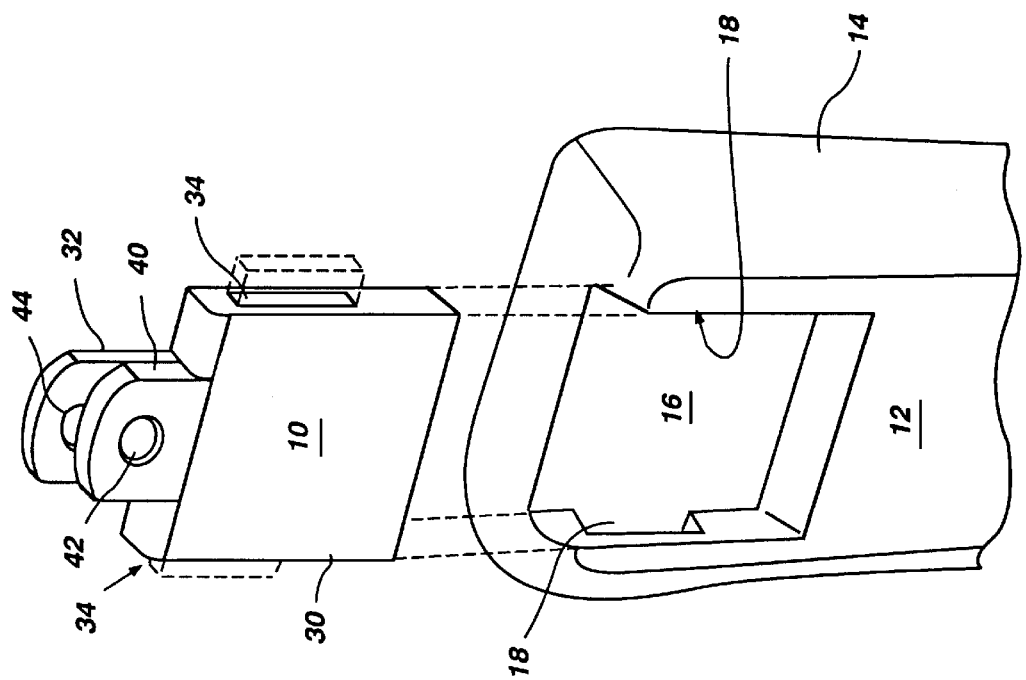
FIG. 2 is an environmental view of a portable electronic apparatus with a lock device in accordance with the present invention installed on a typical use situation.

FIGS. 1 and 2 illustrate a preferred embodiment of a lock device 10 constructed in accordance with the present invention and used in its intended environment. In FIG. 1, an electronic apparatus 12, which suitably may be any of a number of well-known portable devices such as a multimeter or the like, has an outer housing 14 which has a recess 16 formed therein. The outer housing 14 may be molded of a plastic material, as is well known in the art, and recess 16 may be molded integrally therein. The recess 16 extends from one end of the electronic apparatus 12 longitudinally therein to a predetermined point towards the other end of the apparatus 12. The opposing sides of recess 16 each include corresponding first and second rectangularly-shaped openings. The openings extend within the opposing sides of the recess 16 for a predetermined distance to define corresponding pockets 18. Although only one of the pockets 18 is shown in FIG. 1, the opposing side of recess 16 includes an identically configured pocket. Thus, identically configured pockets 18 are located in opposing sides of the recess 16 to selectively fasten the lock device 10 therein as lock device is received into recess 16, as shown in FIG. 2 and described in greater detail below.

Lock device 10, as shown in FIG. 1, includes a housing or body 30, which is preferably injection molded from a tough, durable plastic material, but could be made of metal as well using any of a number of well-known fabrication techniques such as machining or diecasting. Disposed with body 30 is an actuating member 32 that is moved linearly along a first or longitudinal axis to control movement of a pair of retractable locking lugs 34, which move in opposing directions along a second or transverse axis. As shown in solid lines in FIG. 1, the locking lugs 34 are fully retracted to allow the lock device 10 to be inserted into and received by the recess 16 (or removed therefrom). The locking lugs 34 in their extended positions are shown in phantom (dashed lines). In this configuration, locking lugs 34 extend from opposite sides of body 30 to be engaged within pockets 18, securing the lock device 10 to the electronic apparatus 12. The actuating member 32 and locking lugs 34 are preferably injection molded from a tough, durable plastic, but also could be made of metal. The body 30 has a projection or tang portion 40 extending from body 30 and molded integrally therewith. Tang 40 has a hole 42 therein. The actuating member 32 has a similar hole 44 therein, and when actuating member 32 is moved linearly towards the body 30 cause the locking lugs 34 to extend from the body 30, holes 42 and 44 become aligned in registration with each other, as will become apparent as described below in connection with FIG. 2. While not shown, the openings or holes 42 and 44 may be reinforced with hard metal such as stainless steel to prevent defeating the lock by cutting away the material.

FIG. 2 is an environmental view of a portable electronic apparatus 12 with a lock device 10 in accordance with the present invention installed in a typical use situation. With holes 42 and 44 aligned in registration with each other, any kind of elongate member inserted into the holes will prevent movement of actuating member 32 with respect to body 30, thereby preventing removal of lock device 10 from electronic apparatus 12. While the elongate member could be a pin, a nail, a piece of wire, or even a pencil in some cases, a padlock 50 is shown, to which a short piece of wire cable 52 with a loop at each end is also assembled and looped over a pipe or bar 54 to prevent removal of the electronic apparatus 12 from a particular work environment.

Now referring to FIG. 3, there is shown an exploded view of lock device 10. Body 30 is generally rectangular in shape and of a thickness sufficient to accommodate internally disposed parts as will be described hereinbelow. Body 30, as mentioned earlier, has a tang 40 extending therefrom along a longitudinal axis x—x. Body 30 further has a recess 60 therein for receiving a portion of actuating member 32. Recess 60 is generally rectangular in shape, and has a predetermined length along the longitudinal axis x—x and a predetermined width. Actuating member 32 includes an actuator plate 62 having a raised pin or boss 64 thereon and a tang 66 which extends outside the body 30. Actuator plate 62 is generally rectangular in shape and is adapted to be received in recess 60 of body 30. When actuating member 32 is installed, actuator plate is in sliding engagement with the facing surface of recess 60, and tang 66 is in sliding engagement with tang 40 extending from body 30. As such, the actuating member 32 may be moved linearly along the longitudinal axis x—x. Tang 66 may suitably include gripping surfaces 68 along the edges thereof to facilitate a firm grip for moving the actuating member 32.

Body 30 has a notch 70 on each side wall thereof in axial alignment along a transverse axis y—y. Each notch 70 has a predetermined width and a bearing surface 72. Each of a pair of superposed sliding plates 74 and 76 carrying locking lugs 34 has a predetermined width to fit within slots 70. The sliding plates 74 and 76 have slotted holes 78 and 80, respectively, oriented at opposing oblique angles with respect to the longitudinal axis x—x. For manufacturing purposes, sliding plates 74 and 76 may be duplicates of a single part, with one flipped over during assembly. When assembled, boss 64 of actuator plate 62 fits into slotted holes 78 and 80 and cause the sliding plates to move linearly in opposite directions along the transverse axis y—y in response to longitudinal movement of actuating member 32. A retainer plate 84, which may be fabricated of a hard, durable metal such as stainless steel, fits over the sliding parts and may be fastened securely to the body 30 by an convenient fastening method. Screws 86 are shown; however, retainer plate 84 may be fastened with glue, rivets (either metal or integrally molded plastic), or small nut-and-bolt assemblies.

Now referring FIGS. 4 and 5, plan views of lock device 10 are shown with the retainer plate 84 removed to allow the relationship of the parts of the lock mechanism to be viewed in the unlocked and locked positions. In FIG. 4, actuating member is moved along the longitudinal axis x—x by a distance $\Delta x$, which is also the distance along the longitudinal axis x—x of slotted holes 78 and 80 in sliding plates 74 and 76, respectively. Sliding plates 74 and 76, therefore, are drawn together along the transverse axis y—y, causing locking lugs 34 to be retracted. Pushing tang 66 of actuating member 32 toward the body 30 along the longitudinal axis x—x causes boss 64 to slide within slotted holes 78 and 80, causing sliding plates 74 and 76 to move outwardly in opposite directions along transverse axis y—y under the cam action of boss 64 sliding in slotted holes 78 and 80, extending locking lugs 34. The angle of the slotted holes 78 and 80 may be chosen to provide the desired travel along the axis y—y with respect to the distance $\Delta x$ of the actuating member. Of course, a 45-degree angle will result in a one-to-one correspondence of movement if the sliding plates with respects to the actuating member. However, it was noted that smaller diameters of elongate members, e.g., smaller padlocks, inserted through the holes 42 and 44 would allow a slight amount of travel of the actuating member. Thus in the preferred embodiment, the angle was adjusted to provide a four-to-one correspondence between movement of the actuating member 32 and locking lugs 34 to prevent unintentional retraction that would be sufficient to remove the locking device. In other words, the locking lugs 34 move only one-fourth the distance traveled by actuating member 32. FIG. 5 shows the lock device 10 with the locking lugs 34 in their fully extended positions, and with holes 42 and 44 in tangs 40 and 66, respectively, aligned in registration with each other.

While we have shown and described the preferred embodiment of our invention, it will be apparent to those skilled in the art that many changes and modifications may be made without departing from our invention in its broader aspects. It is therefore contemplated that the appended claims will cover all such changes and modifications as fall within the true scope of the invention.

What is claimed is:

1. A lock device for an electronic apparatus, said electronic apparatus having a housing and a generally rectangular recess formed within said housing, said lock device comprising:
   a generally rectangular and flat body adapted to be releasably received within said recess, said body having a lock projection extending from a free end thereof;
   an actuating member having an actuator plate disposed within said body and a lock tang extending outside said body in sliding engagement with said lock projection, said actuating member adapted for movement relative to said body along a first axis between a first and second position; and
   a pair of retractable locking lugs disposed within said body adapted for movement in opposite directions along a second axis transverse to said first axis, each of said pair of retractable locking lugs having an angled slot for engaging a boss on said actuator plate,
   wherein when said actuating member is moved to said first position in alignment with said lock projection said pair of locking lugs are extended from said body for selectively securing said body within said recess, and when said actuating member is moved in said second positions said locking lugs are retracted into said body.

2. A lock device in accordance with claim 1 wherein said lock tang and said lock projection each have an opening therein which are in alignment with each other when said actuating member is in said first position.

* * * * *